Nov. 4, 1952 K. S. KNOL ET AL 2,617,016

MIXING CIRCUIT FOR DECIMETER AND CENTIMETER WAVES

Filed Dec. 22, 1948

INVENTORS.
KORNELIS SWIER KNOL
GESINUS DIEMER
BY Fred M Vogel
AGENT.

Patented Nov. 4, 1952

2,617,016

UNITED STATES PATENT OFFICE 2,617,016

MIXING CIRCUIT FOR DECIMETER AND CENTIMETER WAVES

Kornelis Swier Knol and Gesinus Diemer, Eindhoven, Netherlands, assignors to Hartford National Bank and Trust Company, Hartford, Conn., as trustee Application December 22, 1948, Serial No. 66,802
In the Netherlands January 12, 1948

4 Claims. (Cl. 250—20)

This invention relates to mixing circuits for decimetre and centimetre waves in which a diode or a crystal detector is used for mixing an incoming oscillation and a locally produced oscillation. The object of the invention is to improve the signal-to-noise ratio in such mixing circuits.

For frequency transformation, by mixing, of decimetre and centimetre waves, it is advantageous to use diodes or crystal detectors. It has previously been suggested to increase the conversion slope in a diode mixing-circuit by giving the diode a high negative bias voltage and causing the oscillator to generate a voltage such that, during each wave of the oscillator oscillations, the diode can conduct only for a short period. In this way the diode is traversed by periodic current peaks having the oscillator frequency. However, it has been found that, in the case of very high frequencies, considerable noise is produced. This is probably attributable to the fact that, during the time in which the diode does not conduct, hence during the largest portion of the wage of the oscillator voltage, the noise voltage is produced at the anode through the influence of the cloud of electrons near the cathode. Furthermore, at high positive values of anode voltage, for example voltages in excess of 5 volts, an increase in noise is produced by reflected electrons and secondary emission. When the oscillator voltage has a sinusoidal wave form it must have a small amplitude at high frequencies (wave-length smaller than 1 metre). Therefore the conversion slope becomes low due to the absence of the peak action.

According to the present invention, the local oscillator generates a periodical sequence of positive voltage pulses which are supplied directly to the circuit of the diode or of the crystal detector in such manner that, during the absence of pulses, the diode or the crystal detector is not polarised negatively or is polarised negatively only to a very small extent by the voltage of the oscillator. The term "positive pulse" is to be understood to mean a pulse having a polarity such that it may produce a flow of current in the diode or the crystal detector. A high conversion slope may also be obtained at a value of the positive peak voltage which is not unduly high, both in mixing with the first and in mixing with a higher harmonic of the oscillator voltage, provided that the peaks are sufficiently narrow and the distance between the cathode and the anode is sufficiently small. On the other hand, the height of the peak, if it exhibits steep flanks, may be chosen to be greater since, in this case, the range of voltages in which material noise is produced in the diode due to electron reflection is passed rapidly, while the height of the top comes in a region in which the noise is lower owing to lower electron reflection.

The high-frequency pulses may be generated by half-wave rectification of a high-frequency alternating voltage. However, a more advantageous wave form of the oscillator voltage is obtained if, according to the invention, a pulse generator comprising a special type of tube is used. In this tube, an electron beam is generated and is controlled in the transverse direction by a control oscillation and collected by a collecting electrode. The various parts of the collecting electrode are provided at different distances from the electron source, so that the electrons of the beam require different times to reach the parts of the collecting electrode, the frequency and the shape of the collecting electrode being such that a number of electrons emitted by the electron source at different instants invariably reach the collecting electrode at the same time, so that a pulsatory voltage is set up at the collecting electrode. Such a tube is disclosed in our copending application serial No. 55,457 filed October 20, 1948, now issued as Patent No. 2,519,443. It is thus possible to generate sharp pulses of very high frequency which can be used as the local oscillations in the circuit according to the invention.

Furthermore it is known that a crystal corresponds with a diode in that considerable noise occurs in the circuit of a crystal detector if a high negative bias voltage is applied to the crystal. This inconvenience may also be avoided by the use of the above-described step according to the invention. It may be mentioned that it has previously been suggested to counteract noise in mixing circuits comprising crystals by giving the crystal a determined positive bias voltage. Furthermore it is known to make the local oscillator voltage peak-like by the introduction of higher harmonics. In the known circuits, however, no steps have been taken to prevent at any moment a negative voltage of considerable value from being set up across the circuit of the crystal.

In order that the invention may be more clearly understood and readily carried into effect, it will now be described more fully by reference to the accompanying drawing in which.

Figure 1:
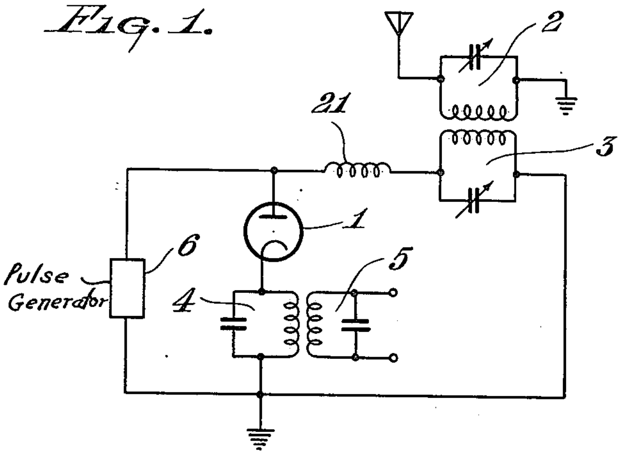
Fig. 1 shows a mixing circuit according to the invention.
Figure 2:
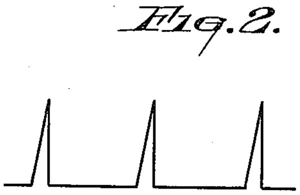
Fig. 2 shows the local oscillator output pulse wave shape.

Fig. 1 shows diagrammatically the manner in which the circuit may be arranged. It is not desirable to have the intermediate-frequency circuit and the local oscillator circuit connected in the conventional manner in series between the anode and the cathode of the diode since serious distortion of the pulses supplied by the local oscillator might thus result. Consequently, in the arrangement shown in Fig. 1, the circuit 3, to which the incoming oscillations are supplied from the aerial circuit 2, and the circuit 4, which is tuned to the intermediate frequency, are connected in series between the anode and the cathode of the diode 1. The pulse generator 6 is provided between the anode and the common point of the two aforementioned circuits. The intermediate-frequency oscillations may be derived from a circuit 5, which is inductively coupled with the circuit 4. The common point of the circuits 3 and 4 is connected to earth. The oscillations generated in the oscillator 6 exhibit substantially the pulse form shown in Fig. 2, so that the diode 1 is prevented at any moment from being negatively polarised by the voltage of the local oscillator. The flanks are preferably made as steep as possible. The local oscillations are supplied directly to the circuit, i. e. without the use of a transformer or other coupling means which might lead to distortion of the pulses. Such couplings might also give rise to negative polarization of the diode during certain portions of the oscillator cycle, which is just what should be avoided. A choke 21 prevents the peak voltage from producing an undue current across the circuit 3.

Figure 3:
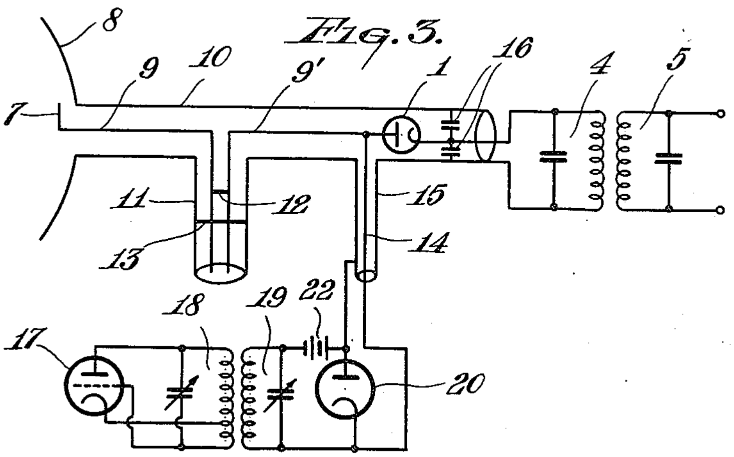
Fig. 3 shows another mixing circuit according to the invention.

Fig. 3 shows a mixing circuit adapted for frequency transformation of ultra-shortwaves.

In this figure reference numeral 7 is the aerial which is arranged within a reflector 8. The aerial 7 is connected to an inner conductor 9 and the reflector 8 to an outer conductor 10 of a concentric high-frequency cable. At 11 there is provided a matching impedance transformer which is constituted by a tubular conductor connected to the conductor 10 and containing two conductors which are connected to the conductor 9 and to the conductor 9′, which is in line with the former. The impedance transformer is adjusted by means of two bridging conductors 12 and 13, of which the conductor 12 connects the inner conductors to one another and the conductor 13 connects the inner conductors to the envelope. Any desired matching may be obtained by shifting of the conductors 12 and 13. The conductor 9′ is connected to the anode of the diode 1, of which the cathode is connected to the upper point of the intermediate-frequency circuit 4. The lower point thereof is connected to the earthed envelope of the system. A simple consideration shows that the circuit shown in Fig. 3 is in every respect comparable with that shown in Fig. 1. The local oscillation is supplied through a conductor 14 to the anode of the diode 1.

Fig. 3 furthermore shows diagrammetically the manner in which the local oscillation is generated. 17 is a triode which is connected as an oscillator. An output circuit 18 is coupled to the circuit connected between the anode and the cathode of a diode 20. The anode of the diode 20 is connected to a tubular conductor 15, which surrounds conductor 14. The latter is connected to the cathode of the diode 20. The circuit may comprise a source of bias voltage which ensures diode conduction during only a small portion of the half-wave. Rectification has the effect of producing a pulse-like voltage which is such as to prevent at any moment a negative bias voltage from being set up across the diode 1. The conductors 14 and 15 may be realised in known manner in the form of a filter which keeps the oscillator circuit free of the signal oscillations. In the circuit shown in Fig. 1, an inductance 21 may be connected in series with the circuit 3, the function of which is to keep the circuit 3 free of the pulse-like voltage. The same result may be obtained with the circuit shown in Fig. 3 by suitable adjustment of the transformer impedance 11.

Figure 4:
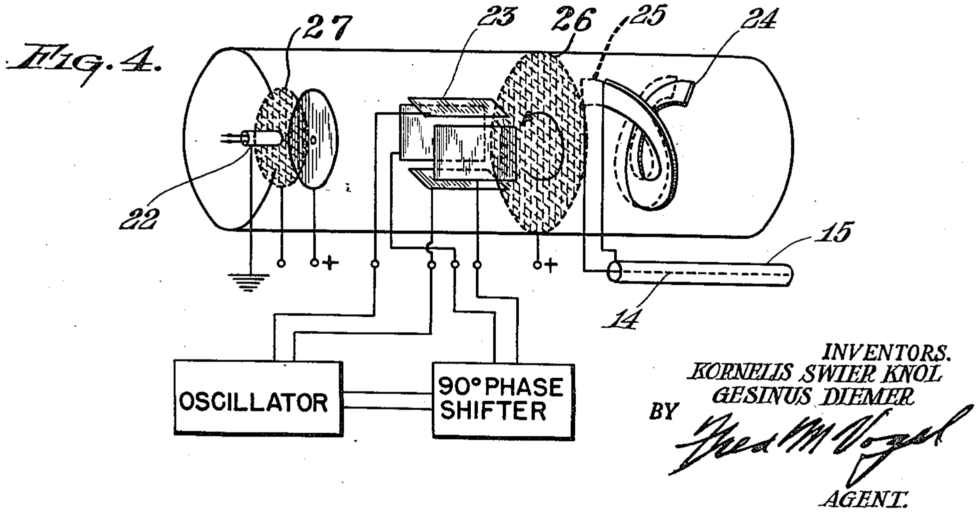
Fig. 4 shows a pulse generator for use in the circuit of the invention.

In the circuit according to the invention use may advantageously be made of a particular kind of pulse generator, the principle of which is shown in Fig. 4. This generator, which is more fully described in U. S. Patent 2,519,443, issued on August 22, 1950, comprises a tube in which an electron beam is generated in a known manner with the use of a cathode 22. The electron beam is controlled by an application of a first signal at the local oscillator frequency to one pair of the deflecting electrodes 23 and a second signal at the local oscillator frequency, but shifted in phase by 90° with respect to the first signal, to the other pair of deflecting electrodes. In this manner the beam is caused to trace a circular path over a conical surface, the frequency of rotation being equal to the local oscillation frequency. Also provided in the generator tube are planar screen members 26 and 27.

The output electrode 24 is shaped as a helix having a single turn, the axis of the helix coinciding with the axis of the beam. The pitch of the helix corresponds substantially to the axial distance traveled by an electron during one cycle of the local oscillation. Assuming that the beam travels in the direction of the arrow shown in the figure, electrons that have passed through the deflecting electrode structure at the start of a cycle of the local oscillation will strike the right-hand end of the output electrode 24 at the same instant that electrons which have passed through the deflecting electrode structure at the end of a cycle strike the left hand end of electrode 24. In like manner, most of the electrons that pass through the deflecting electrode structure during a given local oscillation cycle will strike the collecting electrode at substantially the same instant, producing a sharp short pulse.

Grid electrode 25 is located in front of collecting electrode 24 and is given a similar shape. The output pulse voltage is developed between electrodes 24 and 25 and may be supplied to diode 1 by connecting electrode 24 to conductor 15 and electrode 25 to conductor 14.

The tube shown in Fig. 4 is described more fully in our copending application referred to before. Use of such a tube permits production of sharp current peaks of ultra-high frequency energy by which a high conversion slope and a minimum of noise are achieved in the circuit of the invention.

What we claim is:

1. An electrical circuit arrangement for mixing ultrahigh frequency waves, comprising a unidirectional conductor, means to apply an input signal to said unidirectional conductor, means to generate a local oscillation having a wave form consisting substantially entirely of positive voltage pulses, means to apply said local oscillation to said unidirectional conductor to thereby produce an intermediate frequency wave, and an output circuit coupled to said unidirectional conductor.

2. An electrical circuit arrangement for mixing ultra-high frequency waves, comprising a unidirectional conductor having a pair of electrodes, means to apply an input signal to said unidirectional conductor comprising an input circuit tuned to the frequency of said signal and coupled to one of said electrodes, an output circuit intercoupling said input circuit and the other of said electrodes and having a junction with said input circuit, means to generate a local oscillation having a waveform consisting substantially entirely of positive voltage pulses, and means intercoupling said one electrode and said junction to apply said local oscillation to said unidirectional conductor to thereby produce an intermediate frequency wave.

3. An electrical circuit arrangement for mixing ultra-high frequency waves, comprising an electron discharge tube having anode and cathode electrodes, means to apply an input signal to said anode and cathode electrodes, means to generate a local oscillation having a waveform consisting substantially entirely of positive voltage pulses, means to apply said local oscillation to said anode and cathode electrodes to thereby produce an intermediate frequency wave, and an output circuit coupled to said anode and cathode electrodes.

4. An electrical circuit arrangement for mixing ultra-high frequency waves, comprising a unidirectional conductor, means to apply an input signal to said unidirectional conductor, means to generate a local oscillation having a waveform consisting substantially entirely of positive voltage pulses comprising an electron discharge tube comprising means to form an electron beam and to direct said beam along a given path with a given velocity, deflecting means arranged about said path and adapted to cause said beam to define a circular trace, an anode electrode comprising a helically shaped surface having a single convolution about a central axis coinciding with said path and a grid electrode positioned in the path of said beam and adjacent said anode, said convolution having a pitch substantially equal to the distance traveled by the electrons of said beam during a period of said pulses, means to apply said local oscillation to said unidirectional conductor to thereby produce an intermediate frequency wave, and an output circuit coupled to said unidirectional conductor.

KORNELIS SWIER KNOL.
GESINUS DIEMER.

REFERENCES CITED

The following references are of record in the file of this patent:

UNITED STATES PATENTS

| Number | Name | Date |
|---|---|---|
| 2,382,693 | Dallenbach et al. | Aug. 14, 1945 |
| 2,430,835 | Strutt et al. | Nov. 11, 1947 |
| 2,436,830 | Sharpless | Mar. 2, 1948 |
| 2,463,710 | Montani | Mar. 8, 1949 |